United States Patent [19]

Tarusawa et al.

[11] Patent Number: 5,302,908
[45] Date of Patent: Apr. 12, 1994

[54] HIGH PRECISION PHASE COMPARATOR AND PHASE LOCKED LOOP

[75] Inventors: Yoshiaki Tarusawa, Yokohama; Toshio Nojima, Yokosuka; Kazuaki Murota, Yokohama, all of Japan

[73] Assignees: NTT Mobile Communications Network Inc.; Nippon Telegraph and Telephone Corporation, Tokyo, Japan

[21] Appl. No.: 995,163

[22] Filed: Dec. 22, 1992

[30] Foreign Application Priority Data

Jan. 20, 1992 [JP] Japan .................................. 4-027515

[51] Int. Cl.⁵ .................. H03D 13/00; H03K 9/06
[52] U.S. Cl. .................................. 328/133; 328/155; 307/262; 307/511; 331/1 A; 331/25
[58] Field of Search ................ 328/133, 134, 155; 307/511, 262, 514, 516; 331/1 A, 25; 377/43, 44

[56] References Cited

U.S. PATENT DOCUMENTS 4,178,631 12/1979 Nelson, Jr. .................... 328/133

Primary Examiner—Timothy P. Callahan
Attorney, Agent, or Firm—Pollock, Vande Sande and Priddy

[57] ABSTRACT

A modulus counter counts first clock pulses to modulus M and outputs the count value as an m-bit reference signal, M being an integer. A latch circuit samples and holds the reference signal in response to a trigger signal generated by a trigger signal generator in synchronism with an input signal. A high-speed counter is supplied with second clock pulses of a frequency higher than that of the first clock pulses and starts counting the second clock pulses in response to the trigger signal and stops the counting in response to a first one of the first clock pulses immediately thereafter. A data processor converts the n-bit count value of the high-speed counter to n-bit data corresponding to a phase fraction of a phase quantization step in the latch, combines the n-bit data as low-order bits with m-bit data from the latch and outputs the combined data as phase difference data.

8 Claims, 10 Drawing Sheets

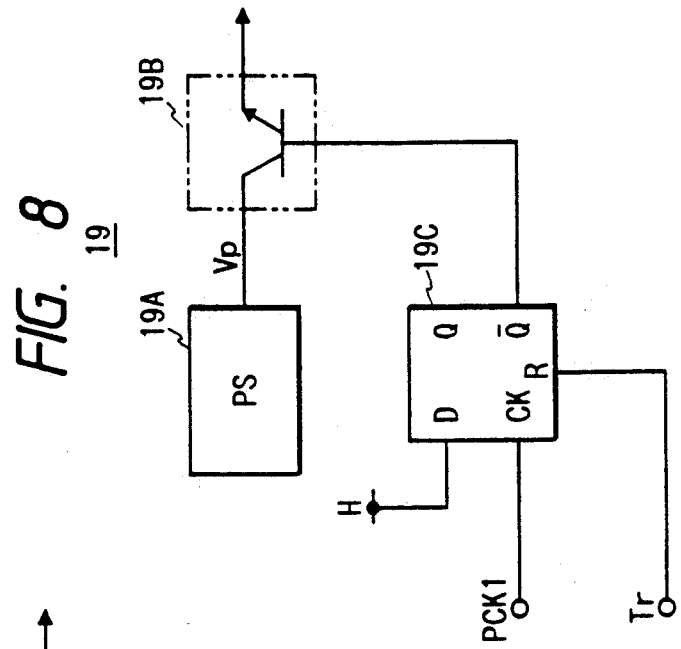
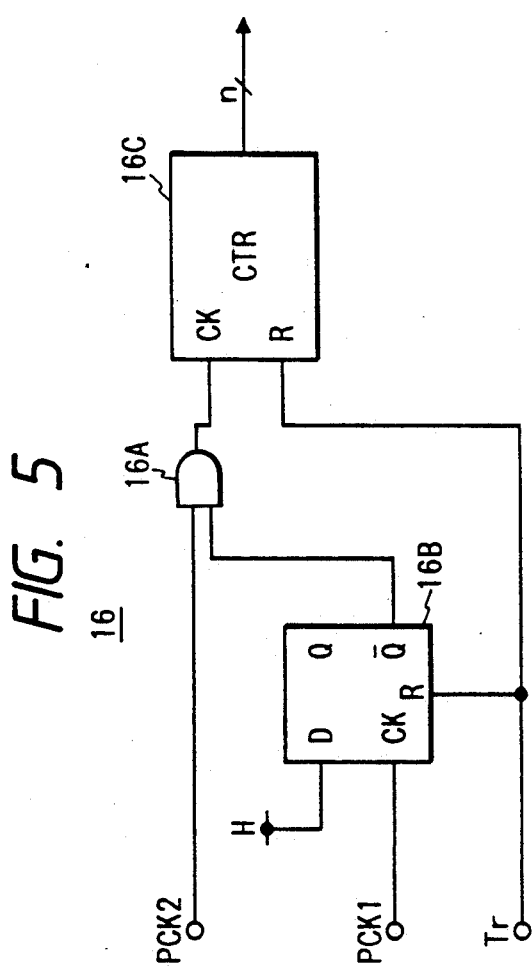
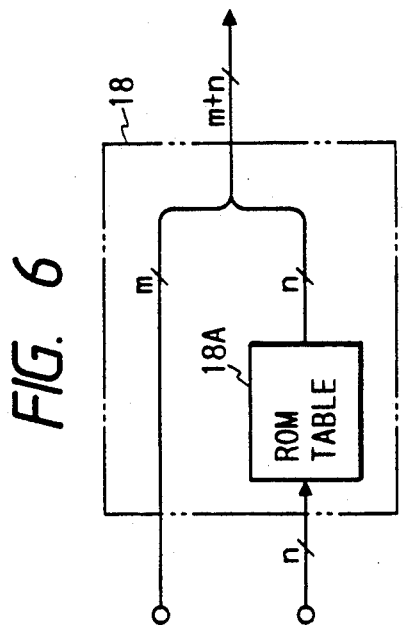

HIGH PRECISION PHASE COMPARATOR AND PHASE LOCKED LOOP

BACKGROUND OF THE INVENTION

The present invention relates to a phase comparator for detecting the difference in phase between two signals with high precision and, more particularly, to a sample-and-hold-type digital phase comparator.

A digital mobile communication system is now being developed as a next generation mobile communication system which will take the place of conventional analogue mobile communication systems. A frequency synthesizer for use in radio equipment for digital mobile communication is adapted to be capable of switching its oscillation frequency, for example, at intervals of 25 kHz around 800 MHz for switching the channel. The frequency switching time needs to be reduced far shorter than in the case of the analogue system. This calls for the development of a frequency synthesizer capable of high-speed switching of frequency and necessitates further reduction of its size and power dissipation as well.

The frequency synthesizer for mobile communications is an oscillator utilizing phase locked loop (PLL) technology. The frequency switching time of such a frequency synthesizer could be effectively reduced by increasing the sensitivity of a phase comparator that is used in the phase locked loop. On the other hand, it is effective in the miniaturization of the synthesizer to form the phase comparator by a digital circuit.

In FIG. 1 there is shown, as a prior art example of the comparator formed by a digital circuit, the principal part of a sample-and-hold-type phase comparator disclosed in Utsui et al, "DIFFERENTIAL DETECTOR USING DIGITAL IC's," IEICE Japan Technical Report CS82-122. This phase comparator outputs, as an m-bit binary number, a phase difference $\Delta\phi$ between a reference signal $S_R$ generated by a reference signal generator 13 and an input signal under measurement, Sx, provided to an input terminal 10. The reference signal generator 13 is made up of a pulse generator 13A and a modulus counter 13B. The modulus counter 13B counts clock pulses PCK (FIG. 2, Row B) from the pulse generator 13A to modulus M which is an integer, and repeatedly outputs a series of count values Cm incremented one by one from O to M. The reference signal level Cm, which is the count value of the counter 13B, takes a staircase-like saw-tooth waveform as shown in FIG. 2, Row A which shows the case of M=3. Thus, the count value Cm corresponds to the phase of the reference signal $S_R$.

The M+1 count values of the modulus counter 13B from O to M are each assigned or allotted to one of M+1 equally-displaced phase values 0 to $2\pi$ rad of the phase $\phi_R$ of the reference signal $S_R$ (which phase $\phi_R$ will hereinafter be referred to as a reference phase). The count value Cm of the counter 13B corresponding to the reference phase $\phi_R$ is sampled by a latch circuit 14 through use of a trigger signal Tr synchronized with the input signal Sx and the sampled value is held as a value corresponding to the phase difference $\Delta\phi$ between the input signal Sx and the reference signal $S_R$. In the example of FIG. 2, a trigger generator 17 generates the trigger signal Tr of Row C (a negative pulse in this example) by the positive edge of the input signal Sx of Row D. By the positive edge of the trigger signal Tr the latch circuit 14 is driven to fetch thereinto the count value Cm of the counter 13B at that time point. The output value Cm of the latch circuit 14 is a binary m-bit digital signal corresponding to the phase difference $\Delta\phi$ between the reference signal $S_R$ and the input signal Sx, and the binary m-bit digital signal will hereinafter be identified by the same symbol $\Delta\phi$ as that of the above-said phase difference.

In such a sample-and-hold-type digital phase comparator as described above, the magnitude of a minimum unit phase or phase accuracy (i.e. a quantization error of phase or quantization step of phase) $\phi_Q$ of the reference phase $\phi_R$ depends on the modulus M which is the maximum count value of the counter 13B, and it can be expressed as follows:

$$\phi_Q = 2\pi/(M+1) \quad (1)$$

Here, the reference phase $\phi_R$ varies with the count value Cm of the modulus counter 13B as expressed as follows:

$$\phi_R = \phi_Q Cm$$

$$Cm = 0, 1, 2, \ldots, M, 0, 1, 2, \ldots, M, 0, 1, 2, \ldots \quad (2)$$

To increase the sensitivity of such a digital phase comparator, the reduction of the quantization step $\phi_Q$ is needed, which is, however, difficult for the reasons given below. As indicated by Eq. (1), the quantization step $\phi_Q$ is dependent on the maximum count value or modulus M of the modulus counter 13B. For instance, a counter of m=2 bits counts from "0" to "3," and in this instance, the quantization step $\phi_Q$ is $2\pi/4$ rad. Since the relationship between the number of bits, m, and modulus M of the counter 13B is $M = 2^m - 1$, Eq. (1) becomes as follows:

$$\phi_Q = 2\pi/2^m \quad (3)$$

Hence, the quantization step $\phi_Q$ could be reduced by increasing the number of bits, m, of the modulus counter 13B. On the other hand, the frequency $f_{CK}$ of the clock pulse PCK from the pulse generator 13A can be expressed as follows:

$$f_{CK} = f_R 2^m \quad (4)$$

where $f_R$ is the repetition frequency of the count value Cm of the counter 13B from "0" to "M" (i.e. the frequency of the reference signal $S_R$). As will be seen from Eq. (4), the clock frequency $f_{CK}$ drastically increases with an increase in the number of bits m. To realize such a very small quantization step $\phi_Q$, it is necessary that the clock frequency $f_{CK}$ be remarkably higher than the frequency $f_R$ of the reference signal $S_R$. For example, in the case of obtaining a quantization step $\phi_Q$ of $2\pi/2^{16}$ (=96 $\mu$rad) when the reference frequency $f_R$ is 25 kHz, the pulse generator 13A needs to generate the clock pulse PCK at a frequency of about 1.6 GHz.

Thus, the conventional phase comparator requires a very high clock frequency $f_{CK}$ to obtain a very small quantization step. It is necessary, therefore, to employ, as the modulus counter 13B, a high-speed counter which operates at high frequencies. Since power dissipation of counters designed for high-speed operation is usually large, the reduction of the quantization step in the conventional phase comparator to improve its sensitivity is accompanied by the defect of its increased power dissipation.

SUMMARY OF THE INVENTION

It is therefore an object of the present invention to provide a phase comparator which is low in power dissipation but has a small phase quantization step.

The phase comparator according to the present invention includes: a first pulse generator which generates first pulses; a modulus counter which counts the first pulses and outputs the count value as a reference phase value; a latch circuit which responds to a trigger signal to sample and hold the reference phase value; a second pulse generator which generates second pulses of a frequency higher than that of the first pulses; a trigger generator which generates a trigger signal synchronized with an input signal; a high-speed counter which starts counting the second pulses in response to the trigger signal and stops the counting in response to the generation of a first pulse from the first pulse generator immediately thereafter; and a data processor which computes the phase difference between the input signal and a reference signal from the outputs of the latch circuit and the high-speed counter.

Since the high-speed counter operates intermittently as mentioned above, the overall power dissipation of the phase comparator can be made far smaller than in the prior art example which requires continuous operation of the high-speed modulus counter. Moreover, since the above-mentioned phase difference is defined by a combination of the outputs from the modulus counter and the high-speed counter, the number of bits that the high-speed counter needs to count can be made smaller than the number of bits for the high-speed modulus counter in the conventional phase comparator. This decreases the circuit size of the high-speed counter and ensures further reduction of its power dissipation.

BRIEF DESCRIPTION OF THE DRAWINGS

FIG. 5 is a block diagram showing an example of a high-speed counter 16 in FIG. 3;

FIG. 6 is a diagram schematically showing an example of a data processor 18 in FIG. 3;

FIG. 8 is a block diagram showing an example of a power supply control circuit 19;

DESCRIPTION OF THE PREFERRED EMBODIMENTS

Figure 3:
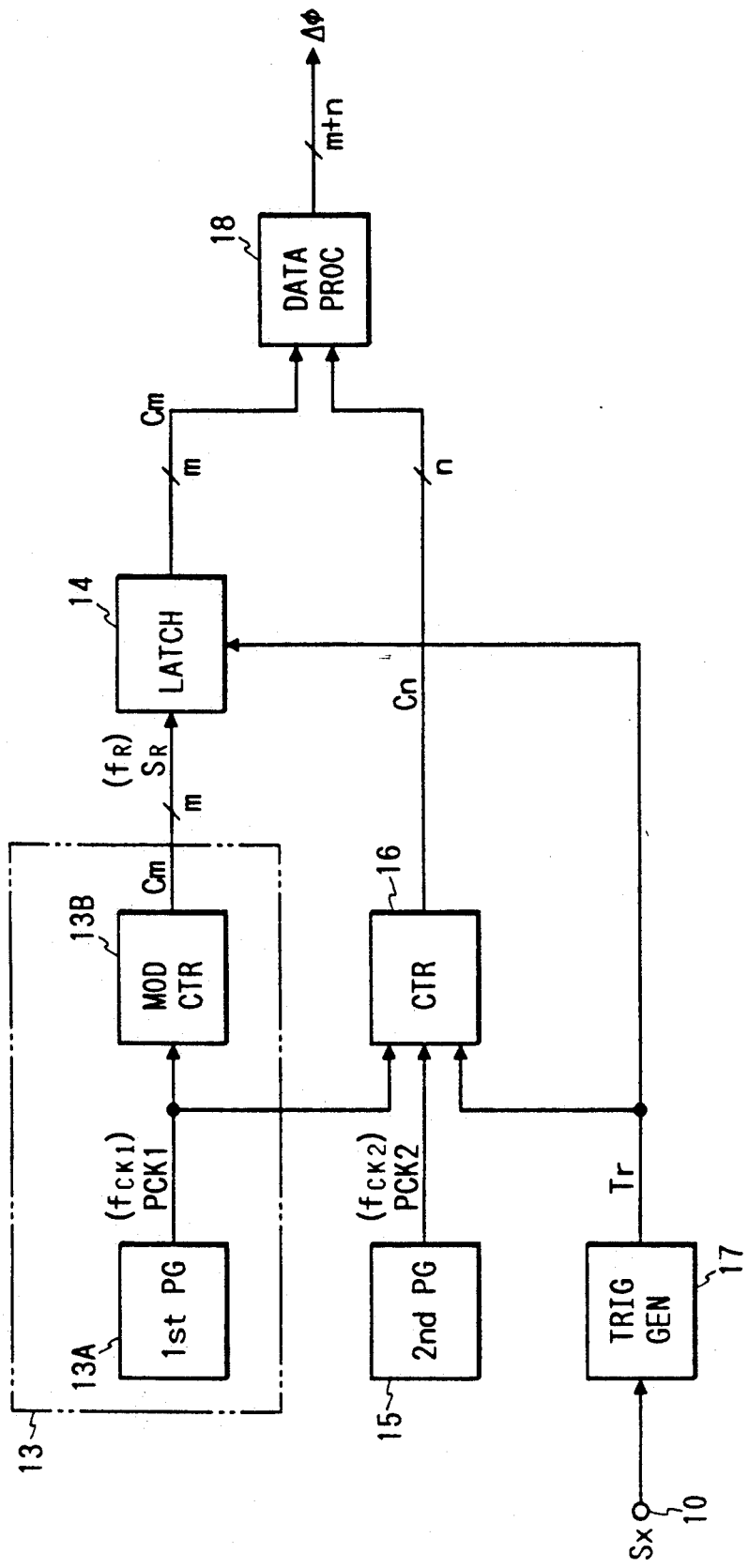
FIG. 3 is a block diagram illustrating an embodiment of the phase comparator according to the present invention.

FIG. 3 illustrates in block form an embodiment of the phase comparator according to the present invention. This embodiment has a construction which further includes, in the conventional phase comparator of FIG. 1, a second pulse generator 15 for generating second clock pulses PCK2 of a frequency higher than that of the first clock pulses PCK1 from the first pulse generator 13A and an n-bit high-speed counter 16 for counting the second clock pulses. A period of fractional phase, which is smaller than the width of the phase quantization step corresponding to the unit count (or the lowest order bit) in the m-bit modulus counter 13B for counting the first clock pulses PCK1, is quantized by the second clock pulses PCK2, by which the overall phase quantization error of the phase comparator is made small.

Figure 1:
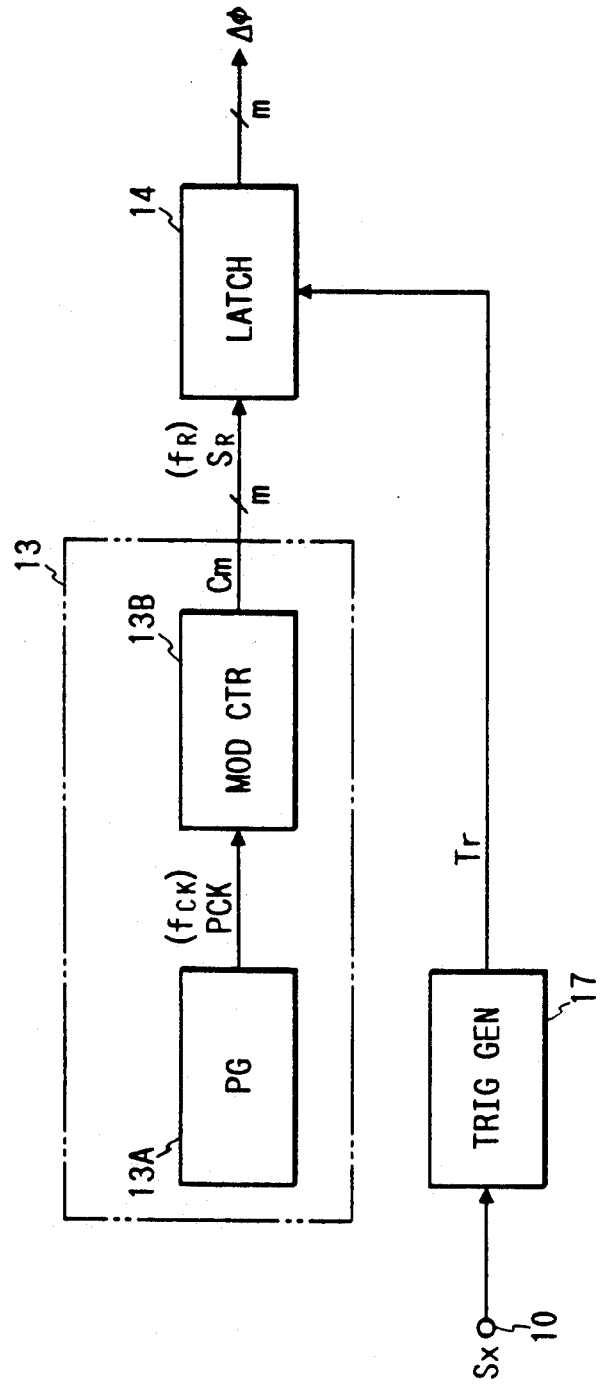
FIG. 1 is a block diagram showing a conventional phase comparator.
Figure 4:
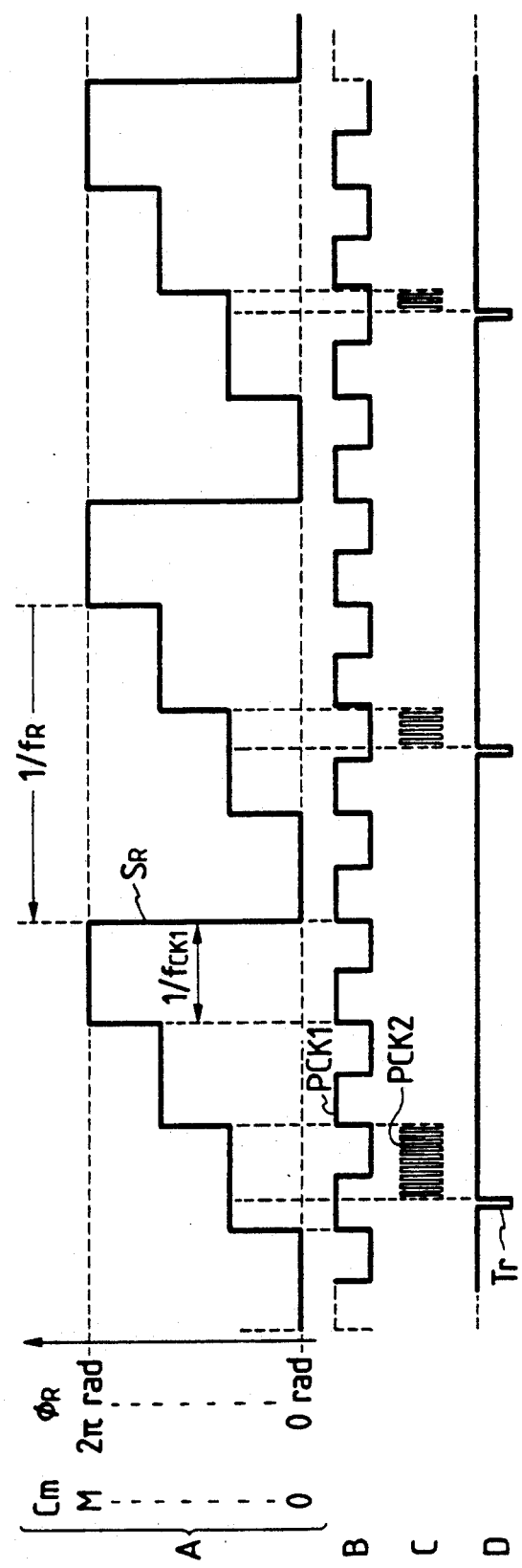
FIG. 4 is a timing chart for explaining the phase comparator shown in FIG. 3.

As in the case of the prior art example shown in FIG. 1, the modulus-M counter 13B counts the first clock pulses PCK1 (FIG. 4, Row B) from the first pulse generator 13A and outputs the m-bit count value Cm as a value corresponding to the reference phase $\phi_R$ of the reference signal $S_R$ which varies as shown in FIG. 4, Row A. For brevity's sake, the number of bits of the modulus counter 13B will hereinafter be identified by the same reference character "m" as that used in FIG. 1 but its numerical value need not always be the same. Accordingly, the value of the modulus M in the embodiment of FIG. 3 is not necessarily the same as the value of the modulus M in the prior art example of FIG. 1. The trigger generator 17 generates a trigger signal Tr (FIG. 4, Row D) synchronized with the input signal Sx provided to the input terminal 10. The latch 14 responds to the trigger signal Tr to latch the count value Cm of the modulus counter 13B at that time as a value corresponding to the reference phase $\phi_R$. Hence, as is the case with the prior art example of FIG. 1, in the latch 14 the phase difference $\Delta\phi$ between the reference signal $S_R$ of the frequency $f_R$ and the input signal Sx is represented in the unit of quantization step $\phi_Q$ expressed by Eq. (3).

The high-speed counter 16 responds to the trigger signal Tr to start counting the second clock pulses PCK2 from the second pulse generator 15 and responds to the immediately subsequent first clock pulse PCK1 to stop the counting. As shown in FIG. 5, the high-speed counter 16 is composed of, for instance, an AND gate 16A which is supplied with the second clock pulses PCK2, a D flip-flop 16B which controls the operation of the AND gate 16A, and an n-bit counter 16C which counts the second clock pulses PCK2 having passed through the AND gate 16A. In this embodiment, the gate 16A, the flip-flop 16B and the counter 16C are each formed by CMOS transistors so as to reduce power dissipation. Hence, the flip-flop 16B and the counter 16C are so-called low-active type circuits which are active when supplied at a reset terminal R with a high level and are reset when supplied with a low level.

The trigger signal Tr resets the n-bit counter 16C and the flip-flop 16B as well. In consequence, an inverted output $\overline{Q}$ of the flip-flop 16B goes high to enable the gate 16A, through which the second clock pulses PCK2 are applied to and counted by the counter 16C as shown in FIG. 4, Row C. When supplied with the first clock pulse PCK1 for the first time after the start of counting of the second clock pulses PCK2, the flip-flop 16B fetches therein the high level always supplied to its data terminal D, making the inverted output $\bar{Q}$ low. As a result of this, the gate 16A is disabled and the counter 16C stops the counting.

As is evident from FIG. 4, the n-bit count value Cn of the counter 16C at the time when its counting stopped corresponds to the phase position of the trigger signal Tr in one cycle of the first clock pulse PCK1, and hence it corresponds to a fraction smaller than the lowest order bit of the m-bit count value Cm held in the latch 14 (which fraction will hereinafter be referred to as a phase fraction). The lowest order bit of the n-bit count value Cn of the counter 16C is representative of a quantization step of a phase fraction and referred to as a fraction quantization step. For instance, when the output frequency $f_{CK2}$ of the second pulse generator 15 is selected to be 32 times higher than the output frequency $f_{CK1}$ of the first pulse generator 13A, the phase quantization step $\phi_Q = 2\pi/4$ rad in the latch 14 can be subdivided into 32 steps by the counting of the second clock pulses PCK2 by the counter 16C.

In general, if the frequency $f_{CK2}$ of the second clock pulses PCK2 is selected as follows:

$$f_{CK2} = k f_{CK1} \tag{5}$$

(where k is an integer equal to or larger than 2)

the fraction quantization step $\phi_{QF}$ in the high-speed counter 16 can be reduced down to 1/k as expressed as follows:

$$\phi_{QF} = \phi_Q/k \tag{6}$$

where $\phi_Q$ is the phase quantization step in the modulus counter 16C. Accordingly, the phase difference $\Delta\phi$ that the phase comparator of this embodiment detects is obtained by a combination of the m-bit value Cm (values from O to M) output from the latch 14 and the n-bit value (values from 0 to k−1) output from the counter 16. The phase difference $\Delta\phi$ is expressed as follows:

$$\begin{aligned}\Delta\phi &= \phi_Q Cm + \phi_{QF}(k - 1 - Cn) \\ &= \phi_Q Cm + \phi_Q(k - 1 - Cn)/k \\ &= \phi_Q\{Cm + (k - 1 - Cn)/k\} = \phi_Q C\end{aligned} \tag{7}$$

$$C = Cm + (k - 1 - Cn)/k \tag{8}$$

The data processor 18 performs the operation of Eq. (8) and outputs an (m+n)-bit result C of the binary operation. Such an operation can easily be implemented by a digital adder-subtracter or ROM table. More specifically, when the data processor 18 is formed by, for example, a circuit including an ROM table 18A as shown in FIG. 6, there are prestored in the ROM table 18A binary n-bit data values of (k−1−Cn)/k in Eq. (8), using the values Cn from O to k−1 as addresses. The input m-bit count value Cm and the n-bit data value read out of the ROM table 18A are combined as high-order and low-order bits, and the data processor 18 provides its output as (m+n)-bit phase difference data C which is usually expressed as follows:

$$C = a_{m-1}2^{m-1} + a_{m-2}2^{m-2} + \ldots \\ + a_0 2^0 + b_1 2^{-1} + b_2 2^{-2} + \ldots + b_n 2^{-n} \tag{9}$$

The coefficients $a_{m-1}, a_{m-2}, \ldots, a_0$ are outputs of the m-bit modulus counter 13B and the coefficients $b_1, b_2, \ldots, b_n$ are n-bit counter 16C as read addresses. By multiplying the phase difference data C of Eq. (9) by $\phi_Q$ as shown in Eq. (7), a phase difference signal is obtained.

Accordingly, the phase difference data C will hereinafter be referred to as a phase difference signal $\Delta\phi$.

For instance, when k is selected to be the n-th power of 2, (k−1−Cn) in Eq. (8) becomes a mere 2's complement of the count value Cn, and 1/k means that the n-bit 2's complement is shifted right n bit positions. Therefore, the phase difference signal can be produced by prestoring 2's complements of the count value Cn at addresses Cn in the ROM table 18A and then combining the m-bit count value Cm with the n-bit complement read out of the ROM table 18A as low-order bits. When k cannot be set at the n-th power of 2, (k−1−Cn) is normalized so that the value k (the number of second clock pulses PCK2 which are generated during one cycle of the first clock pulses PCK1) is converted to the n-th power of 2, that is, (k−1−Cn) is multiplied by $2^n/k$ and the multiplied results are prestored in the ROM table 18A at the addresses Cn. In this case, the n-bit data read out of the ROM table 18A can be combined as low-order bits with the count value Cm. The ROM table 18A is built so that (k−1−Cn) is normalized to the n-th power of 2 as described above.

In this way, the phase difference $\Delta\phi$ between the measured signal Sx and the reference signal $S_R$ can be obtained from the output value Cm of the latch 14 and the output value Cn of the counter 16 with high precision (i.e. with a small quantization error).

As will be evident from the above, when the frequency $f_{CK1}$ of the first clock pulses PCK1 and the value of the modulus M of the modulus counter 13B in the embodiment of FIG. 3 are selected equal to the frequency $f_{CK}$ of the clock pulses PCK and the modulus M of the modulus counter 13B in the prior art example of FIG. 1, the phase comparator of the FIG. 3 embodiment permits phase comparison with a smaller quantization error (i.e. with high precision) than in the case of the prior art example.

In the case where the phase comparator of this embodiment is adapted to generate the same reference frequency $f_R$ as in the case of FIG. 1 and attain the same precision of phase comparison (i.e. the same phase quantization step) as is obtainable with the conventional phase comparator of FIG. 1, the frequency $f_{CK2}$ of the second clock pulses PCK2 which are applied to the counter 16 is selected equal to the frequency $f_{CK}$ of the output clock pulses PCK from the pulse generator 13A in FIG. 1, whereas the first pulse generator 13A in FIG. 3 generates the first clock pulses PCK1 of a frequency $f_{CK1}$ which is 1/k that $f_{CK2}$ of the second clock pulses PCK2. In this case, letting the value of the modulus and the number of bits of the modulus counter 13B in FIG. 3 be represented by M' and m', respectively, the relationship between the modulus M and the number of bits m of the modulus counter 13B in FIG. 1 needs only to satisfy $2^{m'} = 2^m/k$ and $M' = (M+1)/k - 1$.

Figure 2:
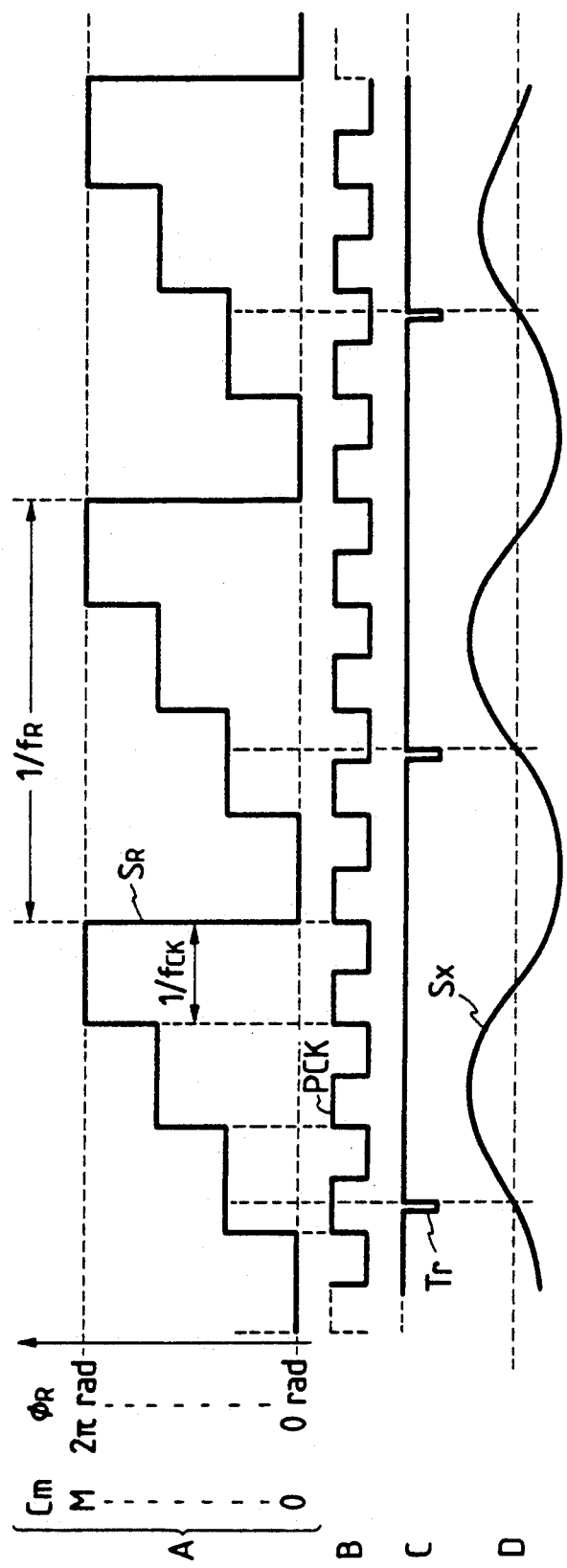
FIG. 2 is a timing chart for explaining the operation of the conventional phase comparator depicted in FIG. 1.

Thus, the number of bits m' of the modulus counter 13B is smaller than in the case of FIG. 1 and the n-bit counter 16 is newly provided. However, since m = m'+n holds the circuit scale of a combination of the counter 13B and the counter 16 in FIG. 3 is about the same as the circuit scale of the counter 13B in FIG. 1. In the case where all the counters in FIGS. 1 and 3 are formed by CMOS transistors with a view to reducing power dissipation, the power which each counter dissipates is in proportion to the number of clock pulses which are counted by the counter. In the prior art example of FIG. 1, as is evident from FIG. 2, the counter 13B always continues to count the clock pulses PCK and maximum number M of clock pulses PCK that the counter 13B can count during one cycle (1/f) period of the reference signal $S_R$ is $2^m-1$ ($=2^{m'+n}-1$). In contrast to this, in the FIG. 3 embodiment of the invention, as is evident from FIG. 4, the high-speed counter 16 performs counting only in one of the periods into which each cycle period (1/$f_R$) of the reference signal $S_R$ is divided by steps of 1/k, and the maximum number of second clock pulses PCK2 that are counted by the high-speed counter 16 during one cycle period of the reference signal $S_R$ is $2^n-1$. Further, since the maximum count value obtainable with the counter 13B is $2^{m'}-1$, the total number of clock pulses which are counted by the both counters during one cycle period of the reference signal $S_R$ is $2^n+2^{m'}-2$, which is smaller than $2^{m'+n}-1$. Hence, the phase comparator of this embodiment dissipates less power than does the prior art example. Moreover, in the case of FIG. 3, the frequency $f_{CK1}$ of the first clock pulses PCK1 is selected as low as 1/k the frequency $f_{CK2}$ of the second clock pulses PCK2 (in the case where it is selected equal to the clock pulse frequency $f_{CK}$ in FIG. 1 as referred to previously)—this also serves to reduce power dissipation of the counter 13B.

In the case where all the counters in FIGS. 1 and 3 are formed by bipolar transistors, each counter dissipates power in proportion to its circuit scale and the maximum clock rate regardless of its counting operation. Usually, power dissipation of a counter designed for counting high-speed clock pulses is large, whereas a counter designed for low-speed clock pulses dissipates less power. In the phase comparator of FIG. 1 a high-speed counter of $m=m'+n$ bits is needed as the modulus counter 13B, but the high-speed counter 16 in the phase comparator of FIG. 3 is n-bit, and hence is smaller in scale than the counter 13B in FIG. 1 and dissipates less power accordingly. Since the m'-bit modulus counter 13B in FIG. 3 needs only to count the low-speed first clock pulses PCK1 (of a frequency 1/k that $f_{CK2}$ of the second clock pulses PCK2), its power dissipation can be designed low. Thus, also in the case of employing bipolar transistors to form the counters, the phase comparator of the FIG. 3 embodiment of the invention dissipates less power than does the conventional phase comparator depicted in FIG. 1.

Figure 7:
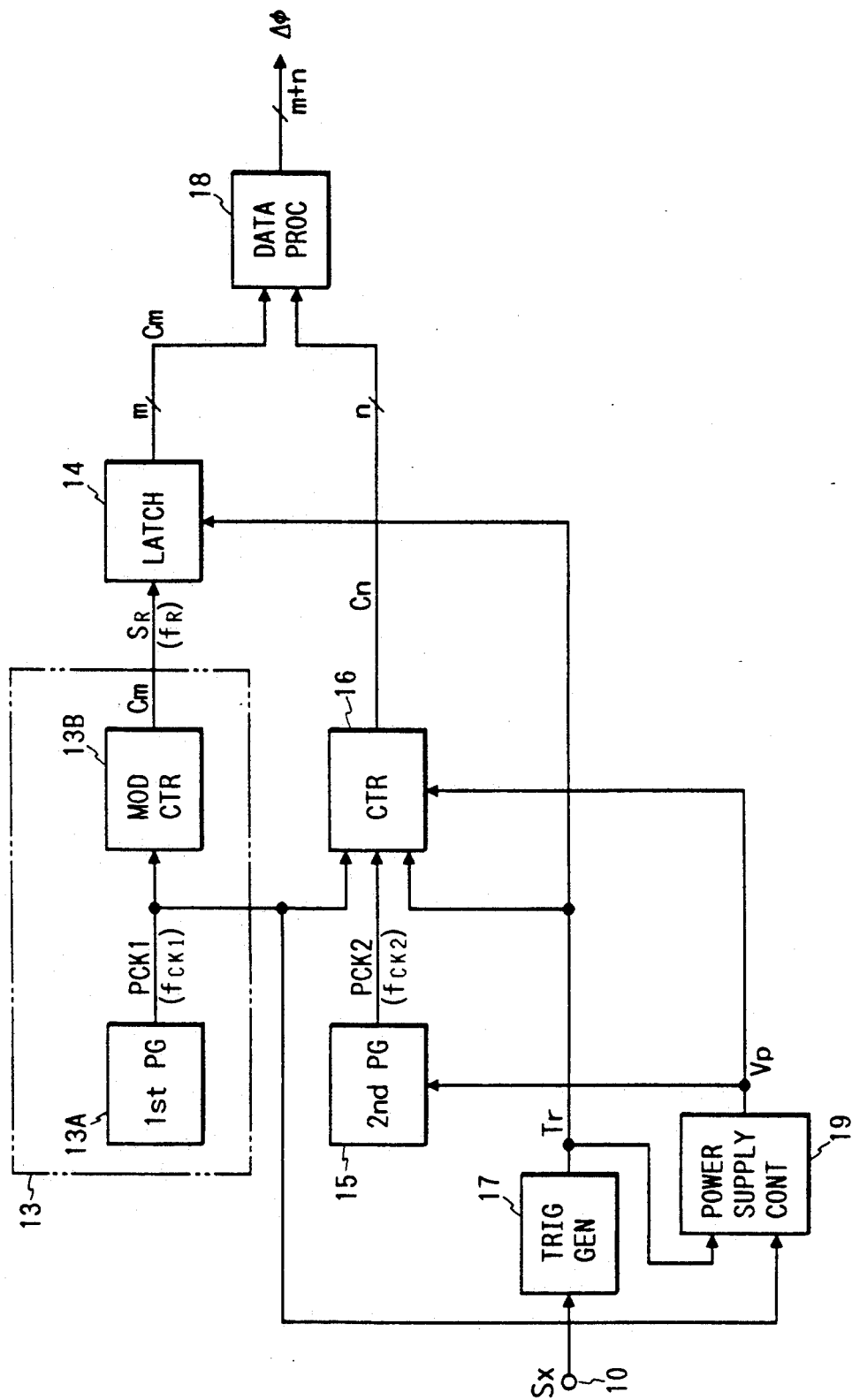
FIG. 7 is a block diagram illustrating a second embodiment of the present invention.

FIG. 7 illustrates in block form a second embodiment of the present invention, which has a construction in which a power supply control circuit 19 is added to the embodiment of FIG. 3. In this embodiment the second pulse generator 15 for generating the high-speed second clock pulses PCK2 and the high-speed counter 16 are supplied with a drive voltage Vp for only a period of time during which the counter 16 counts the second clock pulses PCK2—this is intended to further reduce power dissipation.

Figure 9:
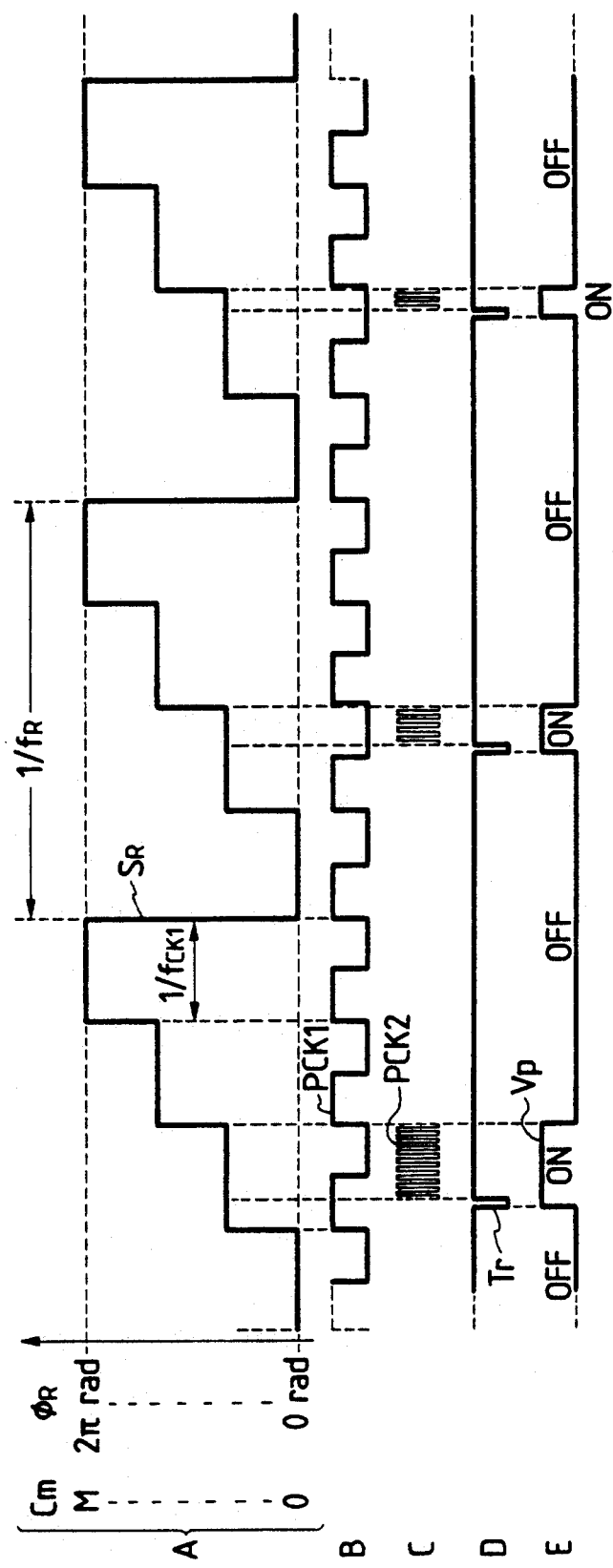
FIG. 9 is a timing chart for explaining the operation of the second embodiment depicted in FIG. 7.

The power supply control circuit 19 comprises, as depicted in FIG. 8, for instance, a power supply circuit 19A which outputs the power supply voltage Vp, a switching circuit 19B for ON-OFF control of the supply of the voltage Vp to the second pulse generator 15 and the high-speed counter 16, and a D flip-flop 19C which outputs a control signal for ON-OFF control of the switching circuit 19B. Incidentally, the power supply circuit 19A provides, though not shown, the power supply voltage to other circuits as well as the second pulse generator 15 and the counter 16 in FIG. 7. The D flip-flop 19C is always supplied at its data terminal D with a high level. Also in this embodiment, the flip-flop 19C is formed by CMOS transistors, and is active when a signal (FIG. 9, Row D) applied to its reset terminal R is high-level, and its inverted output $\overline{Q}$ is held low-level by the clock pulse PCK1 being applied to the clock terminal CK. Consequently, as shown in FIG. 9, Row E, the switching circuit 19B remains in the OFF state and the power supply voltage Vp is not fed to the second pulse generator 15 and the high-speed counter 16. When the trigger signal Tr, which is a negative pulse depicted in FIG. 9, Row D, is applied to the reset terminal R, the flip-flop 19C is reset and its inverted output $\overline{Q}$ goes high, turning ON the switching circuit 19B as shown in FIG. 9, Row E. As a result, the power supply voltage Vp is fed to the second pulse generator 15 and the high-speed counter 16, starting the generation and counting of the second clock pulses PCK2. By the positive edge of the first clock pulse PCK1 which is applied to the clock terminal CK for the first time thereafter, the flip-flop 19C is actuated to fetch the high level at the terminal D and the inverted output $\overline{Q}$ goes low, turning OFF the switching circuit 19B as shown in FIG. 9, Row E.

With such a construction of the power supply control circuit 19 which supplies the power supply voltage Vp to the second pulse generator 15 and the counter 16 for only the period of time during which the counter 16 performs counting, even if the counter 16 is formed by an ECL or TTL of bipolar transistors which requires a fixed bias current regardless of the pulse counting, the average power dissipation of the counter 16 can be remarkably reduced as in the case of the counter 16 being formed by a CMOS circuit. Let the sum of power dissipated by the second pulse generator 15 and the counter 16 be represented by Po and consider the case of one cycle period of the first clock pulse PCK1 which is the maximum ON period of the switching circuit 19B. Average power $P_{AB}$ is obtained by the following equation from the output frequency $f_{CK1}$ of the first pulse generator 13A and the reference signal frequency $f_R$.

$$P_{AB}=Po\cdot f_R/f_{CK1} \tag{10}$$

Eq. (11) can be modified by use of Eq. (4) into the following equation:

$$P_{AB}=Po/2^m \tag{11}$$

For example, when the number of bits m of the modulus counter 13B is 4, average power dissipation by the second pulse generator 15 and the counter 16 can be reduced down to 1/16 the power needed in the case where no ON-OFF control of the power supply takes place. Thus, the phase comparator of this embodiment has high precision of phase comparison and is low in power dissipation.

Figure 10:
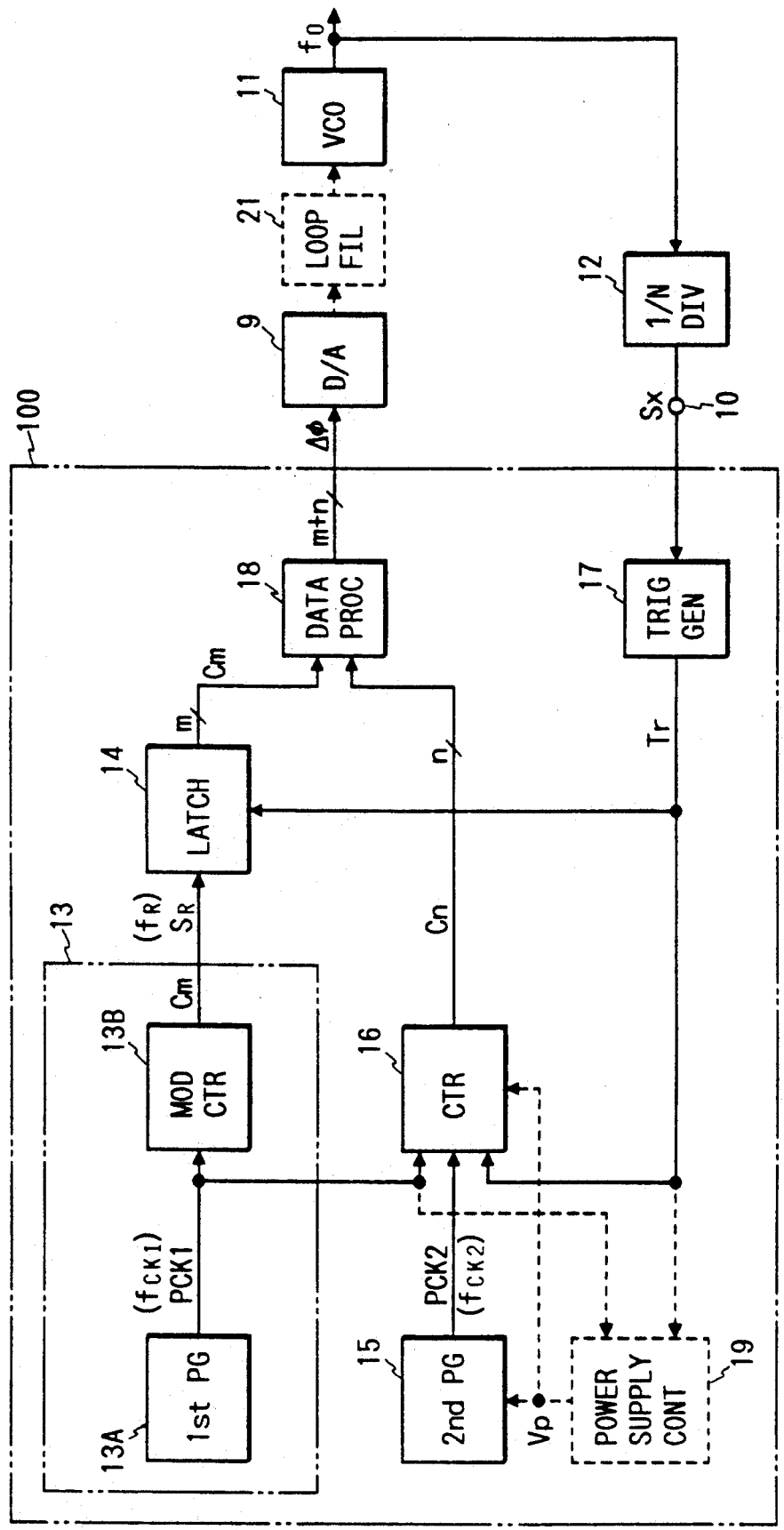
FIG. 10 is a block diagram illustrating a third embodiment of the present invention.

FIG. 10 illustrates in block form a third embodiment of the present invention, which has a construction in which a digital-to-analog converter (hereinafter referred to as a D-A converter) 9, a voltage controlled oscillator (hereinafter referred to as a VCO) 11 and a programmable divider 14 are added to the phase comparator of FIG. 3 indicated generally by the block 100. The digital phase difference signal $\Delta\phi$ of m+n bits from the phase comparator 100 is converted by the D-A converter 9 to an analog voltage, which is applied to the VCO 11 to control its oscillation frequency fo, and a signal, obtained by frequency dividing the oscillation frequency fo by the programmable divider 12 down to 1/N, is provided as the input signal Sx to the input terminal 10, thereby forming a feedback loop.

The feedback is a phase locked loop which operates so that the frequency $f_R$ of the reference signal $S_R$ from the modulus counter 13B and the output frequency fo/N (where N is a positive integer) of the programmable divider 12 match each other. Hence, the output frequency fo of the VCO 11 can be expressed as follows:

$$fo = N \cdot f_R \quad (12)$$

Therefore, the output frequency fo can be set at an integral multiple of the reference frequency $f_R$ by changing the frequency dividing factor N of the programmable divider 12. The embodiment shown in FIG. 10 constitutes a phase locked loop oscillator commonly referred to as a frequency synthesizer.

Such a phase locked loop oscillator employing the phase comparator 100 of the first embodiment has high phase detector sensitivity, and hence it permits reduction of the transient response time during the frequency switching. For instance, the phase detector sensitivity $K\phi$ of the conventional phase detector using the m-bit modulus counter 13B shown in FIG. 1 is given by the following equation:

$$K\phi = 2^m/2\pi \quad (13)$$

On the other hand, the phase detector sensitivity of the phase comparator of FIG. 3 which utilizes the n-bit counter 16 is given by the following equation:

$$K\phi = 2^{m+n}/2\pi \quad (14)$$

Thus, the phase detector sensitivity can be improved remarkably.

The settling time of the phase locked loop oscillator is determined by the phase comparison sensitivity, the VCO sensitivity and the frequency dividing factor N. The higher the phase comparison sensitivity, the shorter the settling time. Hence, the phase locked loop oscillator of this embodiment permits high-speed frequency switching. Moreover, power dissipation can be substantially reduced by controlling the power supply to the second pulse generator 15 and the counter 16 through use of the power supply control circuit 19 as indicated by the broken line in the block 100 in FIG. 10.

In the embodiment of FIG. 10, when no loop filter is provided at the output side of the phase comparator 100, a steady phase error is induced in the phase difference $\Delta\phi$ between the reference phase $\phi_R$ and the signal Sx from the programmable divider 12 during the steady oscillation state in which no frequency switching takes place. This steady phase error can be reduced to zero by providing a loop filter 21 at the output side of the phase comparator 100 as indicated by the broken line in FIG. 10. In this instance, when formed by an analog circuit, the loop filter 21 is disposed at the output side of the D-A converter 9 as depicted in FIG. 10, but when formed by a digital circuit, it is placed at the output side of the data processor 18.

Figure 11:
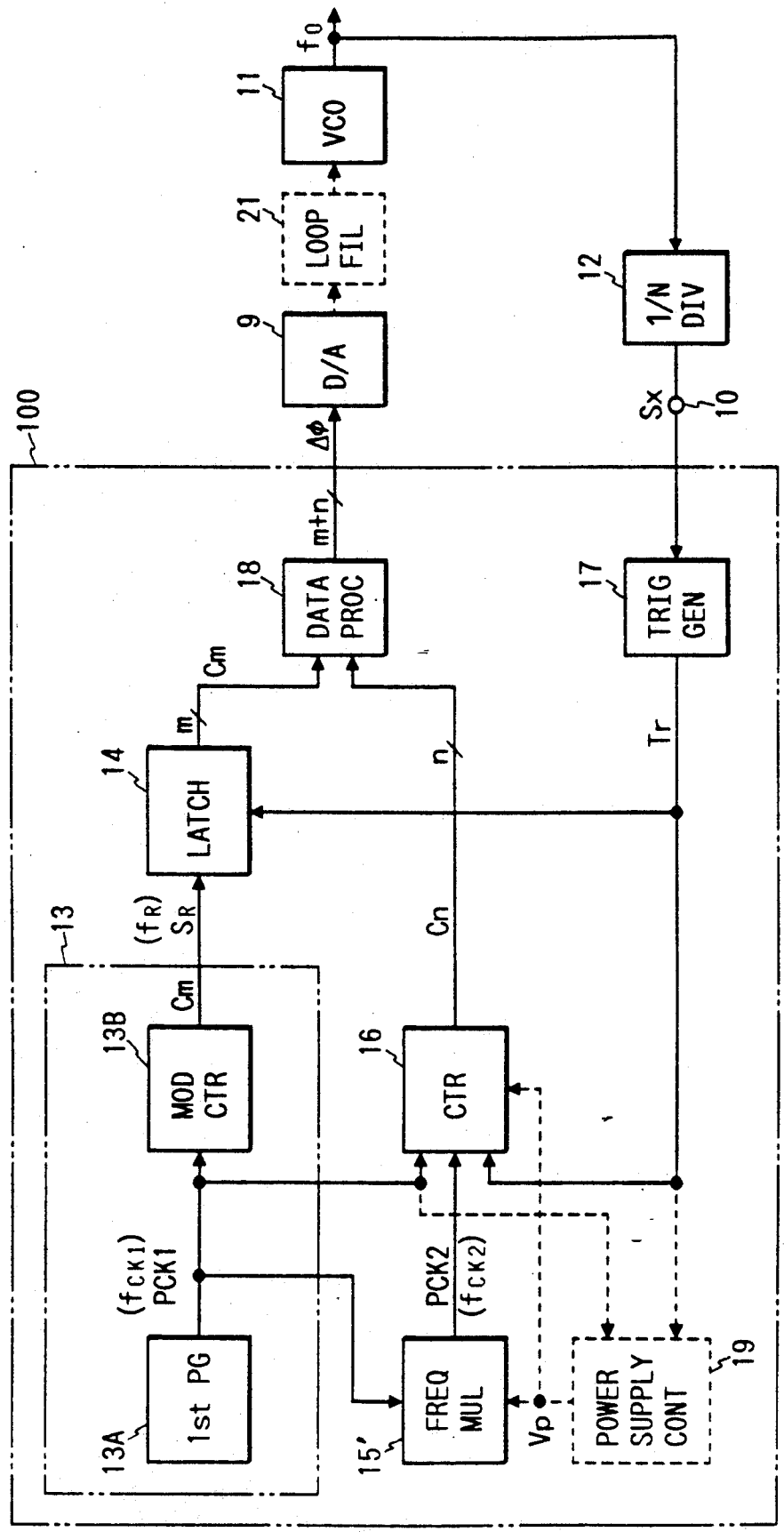
FIG. 11 is a block diagram illustrating a fourth embodiment of the present invention.

FIG. 11 illustrates in block form a fourth embodiment of the present invention, which employs a frequency multiplier 15' in place of the second pulse generator 15 in the FIG. 10 embodiment. The frequency multiplier 15' multiplies the frequency $f_{CK1}$ of the first clock pulses PCK1 from the first pulse generator 13A by k, for instance, and provides the k-multiplied signal as the second clock pulse PCK2 to the counter 16. Such a construction also produces the same effect as that obtainable with the FIG. 10 embodiment. In addition, since the first clock pulses PCK1 from the first pulse generator 13A and the second clock pulses PCK2 output from the frequency multiplier 15' are synchronized in phase, the error in the phase difference output $\Delta\phi$ which will ultimately be obtained is very small. Hence, phase noise in the output signal of the VCO 11 can be reduced. It is evident that power dissipation can be reduced, as described previously, by providing the power supply control circuit 19 in the phase comparator 100 as indicated by the broken line.

Figure 12:
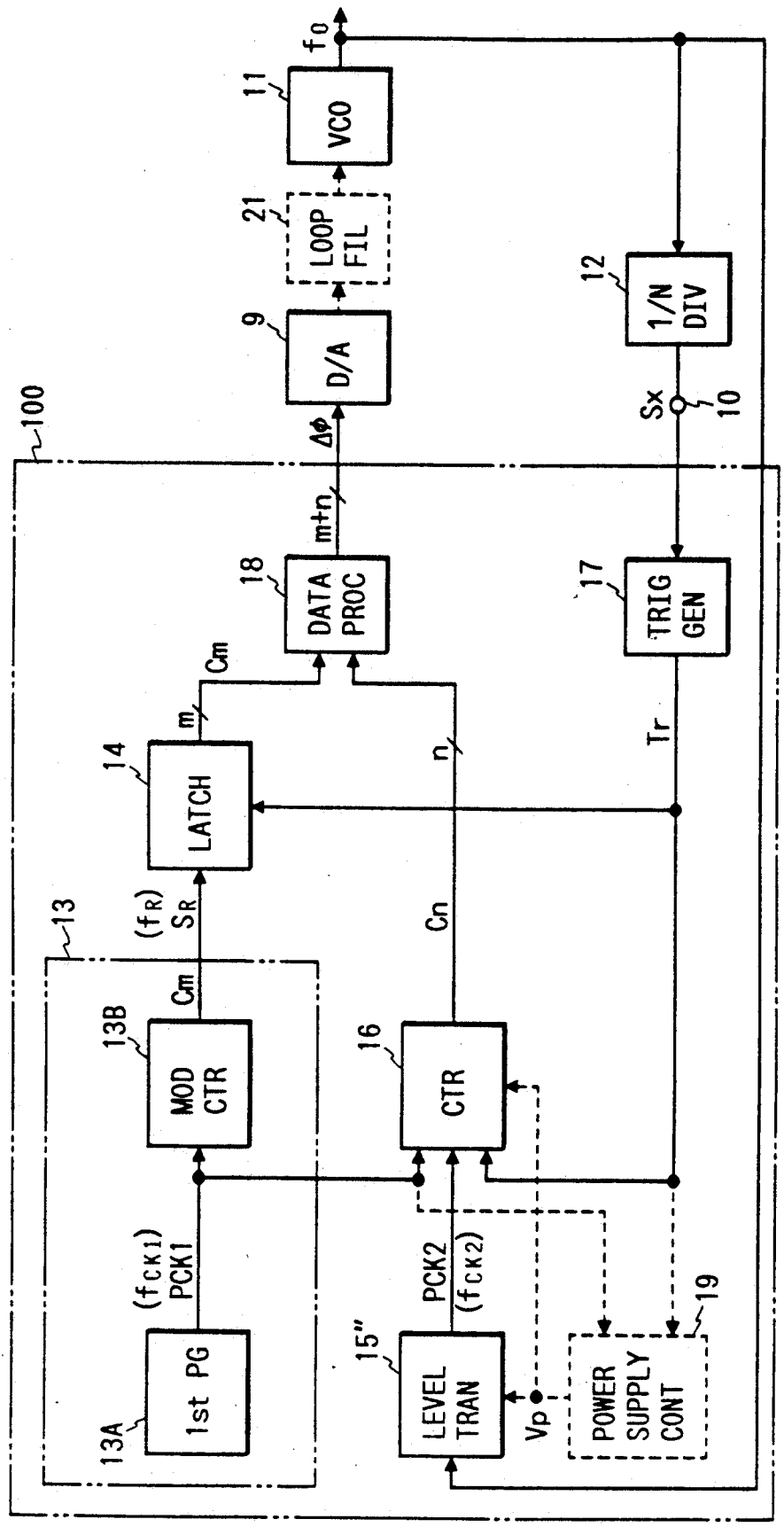
FIG. 12 is a block diagram illustrating a fifth embodiment of the present invention.

FIG. 12 illustrates in block form a fifth embodiment of the present invention, which utilizes the output signal from the VCO 11 as the second clock pulse PCK2 from the second pulse generator 15 in the embodiment of FIG. 10. When it is necessary to transform the output signal of the VCO 11 to a logical level which can be counted by the counter 16, such as a TTL or ECL level, a level transformer 15'' is provided. The additional provision of a frequency multiplier or frequency divider will produce such an effect as described below.

Such a construction is effective in the case where the output frequency fo of the VCO 11 is very higher than the frequency $f_{CK1}$ of the first clock pulse PCK1 from the first pulse generator 13A. Since the frequency $f_{CK2}$ of the second clock pulse PCK2 is in proportion to the output frequency fo of the VCO 11, the relationship between the first and second clock pulse frequencies $f_{CK1}$ and $f_{CK2}$ varies with the output frequency fo. Consequently, the phase quantization step varies with frequency and the error in the phase difference output $\Delta\phi$ changes accordingly. When the range of variation of the output frequency fo is small, however, the error in the phase difference output $\Delta\phi$ is so small that it does not matter. In mobile communications, for example, a 25-MHz band width is assigned in a 800-MHz band and, in this band, frequencies spaced 25 kHz apart are assigned to respective channels. In the case of using the phase locked loop oscillator of FIG. 12 as a frequency synthesizer in radio equipment for such a mobile communication system, the variation width of the output frequency fo of the VCO 11 needs to be 25 MHz, and this is 3.125% of the center frequency 800 MHz. Accordingly, a change in the fraction quantization step $\phi_{QF}$ in the high-speed counter 16 is also 3.125% at most. Thus, the second pulse generator 15 in the phase locked loop oscillator shown in FIGS. 10 and 11 can be omitted as depicted in FIG. 12—this ensures reduction of the circuit size and power dissipation.

As described above, the phase comparator according to the present invention permits highly accurate detection of the phase difference with low power dissipation. When the phase comparator is applied to a phase locked loop oscillator, its settling time is short and frequency switching can be effected at high speed, because the phase comparator has high phase comparison sensitivity. Moreover, the principal part of the phase comparator can be formed by digital circuits, it can easily be fabricated as an integrated circuit, and hence can be reduced in size.

It will be apparent that many modifications and variations may be effected without departing from the scope of the novel concepts of the present invention.

What is claimed is:

1. A phase comparator comprising:

first pulse generator means which generates first clock pulses of a first frequency;

modulus counter means which counts said first clock pulses to modulus M and outputs the count value as a reference signal, said M being a positive integer;

trigger signal generator means which generates a trigger signal synchronized with an input signal;

latch means which responds to said trigger signal to sample and hold said count value of said modulus counter means;

second pulse generator means which generates second clock pulses of a second frequency higher than said first frequency;

high-speed counter means which counts said second clock pulses, said high-speed counter means starts counting of said second clock pulses in response to said trigger signal synchronized with said input signal and stops said counting in response to a first shot of said first clock pulses thereafter; and data processor means which generates phase difference data corresponding to a phase difference between said reference signal and said input signal, on the basis of data held in said latch means and counted data of said high-speed counter means.

2. The phase comparator of claim 1 which further includes power supply control means which responds to said trigger signal and the immediately following one of said first clock pulses to control the power supply to at least said high-speed counter means during its counting period alone.

3. The phase comparator of claim 2 wherein said power supply control means is adapted to supply power to said second pulse generator means during only said counting period of said high-speed counter means.

4. The phase comparator of claim 1 wherein said data processor means includes data transform means which transforms said counted data of said high-speed counter means into low-order bits corresponding to a fraction of said phase difference detected by said latch means.

5. The phase comparator of claim 1, 2, 3 or 4 which further includes digital-to-analog converter means for converting said phase difference data to an analog phase difference voltage corresponding to said phase difference, voltage controlled oscillator means whose oscillation frequency is controlled in accordance with said phase difference voltage, and programmable divider means which divides the oscillation output frequency of said voltage controlled oscillator means by an arbitrary integer and provides the frequency-divided output as said input signal to said trigger signal generator means, said digital-to-analog converter means, said voltage controlled oscillator means and said programmable divider means constituting a negative feedback loop whereby said input signal is synchronized in phase with said reference signal.

6. The phase comparator of claim 5 wherein said second pulse generator means is frequency multiplier means which frequency multiplies said first clock pulses from said first clock pulses from said first clock pulse generator means and outputs them as said second clock pulses.

7. The phase comparator of claim 5 wherein said second clock pulse generator means is signal converter means which outputs, as said second clock pulses, pulses synchronized with the oscillation output of said voltage controlled oscillator means.

8. The phase comparator of claim 5 wherein said negative feedback loop includes a loop filter connected in series to the output side of said data processor means.

* * * * *